United States Patent
Xiao et al.

(10) Patent No.: US 10,038,258 B2
(45) Date of Patent: Jul. 31, 2018

(54) PRESSING MEMBER AND ELECTRICAL CONNECTOR ASSEMBLY

(71) Applicant: FOXCONN INTERCONNECT TECHNOLOGY LIMITED, Grand Cayman (KY)

(72) Inventors: Qin-Yao Xiao, Kunshan (CN); Heng-Kang Wu, Shenzhen (CN); Fu-Jin Peng, Shenzhen (CN); Tzu-Li Chu, New Taipei (TW)

(73) Assignee: FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 11 days.

(21) Appl. No.: 15/295,987

(22) Filed: Oct. 17, 2016

(65) Prior Publication Data

US 2017/0110815 A1   Apr. 20, 2017

(30) Foreign Application Priority Data

Oct. 16, 2015 (CN) .................... 2015 2 0799347 U

(51) Int. Cl.
  *H01R 12/00* (2006.01)
  *H01R 12/70* (2011.01)
  *H01R 13/62* (2006.01)
  *H05K 7/10* (2006.01)
  *H05K 7/12* (2006.01)

(52) U.S. Cl.
  CPC ......... *H01R 12/7058* (2013.01); *H01R 13/62* (2013.01); *H05K 7/1061* (2013.01); *H05K 7/12* (2013.01)

(58) Field of Classification Search
  CPC .......... H01R 12/7058; H01R 13/62994; H01R 12/7005; H01R 13/62
  USPC ........................................ 439/948, 345, 73
  See application file for complete search history.

(56) References Cited

U.S. PATENT DOCUMENTS

| | | | |
|---|---|---|---|
| 6,908,316 B2 * | 6/2005 | Ma ....................... | H05K 7/1053 439/331 |
| 7,101,210 B2 * | 9/2006 | Lin ...................... | H05K 7/1061 439/331 |
| 7,338,308 B2 * | 3/2008 | Nakao .................. | G01R 1/0466 439/331 |
| 7,497,716 B2 * | 3/2009 | Hsu ..................... | H05K 7/1061 439/331 |
| 7,575,449 B1 * | 8/2009 | Cai ..................... | H05K 7/1053 439/135 |

(Continued)

FOREIGN PATENT DOCUMENTS

CN   103855506   11/2012

*Primary Examiner* — Abdullah Riyami
*Assistant Examiner* — Nader Alhawamdeh
(74) *Attorney, Agent, or Firm* — Wei Te Chung; Ming Chieh Chang

(57) ABSTRACT

A pressing member is used for downwardly pressing on a chip module. The pressing member has a main body and a central opening going through the main body. The main body has an upper surface and a lower surface opposite to the upper surface. The central opening is provided for a part portion of the chip module going through. The pressing member has a pressing portion protrudes upwardly from the upper surface and provided for an external device pressing downwardly on to make the main body press downwardly on the chip module so as to prevent the chip module from warping.

17 Claims, 9 Drawing Sheets

(56) References Cited

U.S. PATENT DOCUMENTS

| | | | | |
|---|---|---|---|---|
| 8,233,284 B2* | 7/2012 | Ju | ............................ | H05K 7/00 |
| | | | | 174/32 |
| 8,647,138 B1* | 2/2014 | Chen | .................... | H05K 7/1007 |
| | | | | 439/331 |
| 8,734,177 B2* | 5/2014 | Tsai | ....................... | H01R 12/52 |
| | | | | 439/331 |
| 8,998,625 B2* | 4/2015 | Yeh | ........................ | H01R 13/62 |
| | | | | 439/136 |
| 9,225,091 B2* | 12/2015 | Ju | ........................ | H01R 12/79 |
| 2006/0128201 A1* | 6/2006 | Ju | ........................ | H05K 7/1061 |
| | | | | 439/331 |
| 2009/0075512 A1* | 3/2009 | Liao | .................... | H05K 7/1061 |
| | | | | 439/345 |
| 2012/0108096 A1* | 5/2012 | Yeh | ..................... | H05K 7/1053 |
| | | | | 439/345 |
| 2012/0252239 A1* | 10/2012 | Ju | ........................ | H01R 12/85 |
| | | | | 439/157 |
| 2012/0302082 A1* | 11/2012 | Gattuso | .................... | H05K 7/12 |
| | | | | 439/345 |
| 2017/0110815 A1* | 4/2017 | Xiao | ........................ | H05K 7/12 |

* cited by examiner

US 10,038,258 B2

PRESSING MEMBER AND ELECTRICAL CONNECTOR ASSEMBLY

BACKGROUND OF THE INVENTION

1. Field of the Invention

The present invention generally relates to a pressing member and an electrical connector assembly, more specifically, the electrical connector assembly having the pressing member.

2. Description of Related Art

U.S. Pat. No. 8,506,316 discloses an electronic device. The electronic device is used for connecting with a chip module and comprises an insulating housing, a plurality of conductive terminals retained in the insulating housing, a clip carrying the chip module and a cover carrying the clip and the chip module to assemble to the insulating housing. The cover has a pressing portion provided for pressing on a middle area of the chip module. Corners of the chip module are easy to be warped due to large pressing force provided from the pressing portion.

Therefore, a new pressing member and a new electrical connector assembly are desired hereinafter.

SUMMARY OF THE INVENTION

Accordingly, an object of the present invention is to provide a new pressing member and a new electrical connector assembly so as to make a chip module be not easy to be warped.

In order to achieve the object set forth, a pressing member used for downwardly pressing on a chip module comprises a main body having an upper surface and a lower surface opposite to the upper surface and a central opening going through the main body and provided for a part portion of the chip module going through. The pressing member has a pressing portion protrudes upwardly from the upper surface and provided for an external device pressing downwardly on to make the main body press downwardly on the chip module so as to prevent the chip module from warping.

Other objects, advantages and novel features of the invention will become more apparent from the following detailed description when taken in conjunction with the accompanying drawings.

DETAILED DESCRIPTION OF THE INVENTION

Figure 1:
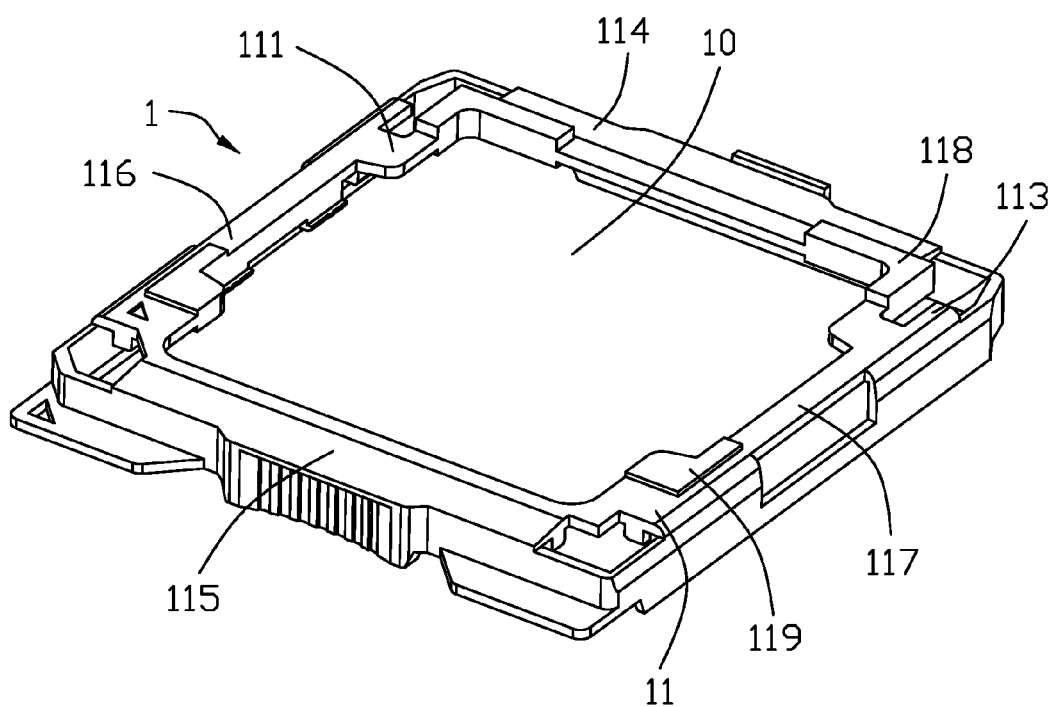
FIG. 1 is a perspective view of a pressing member of a first embodiment in the present invention.
Figure 2:
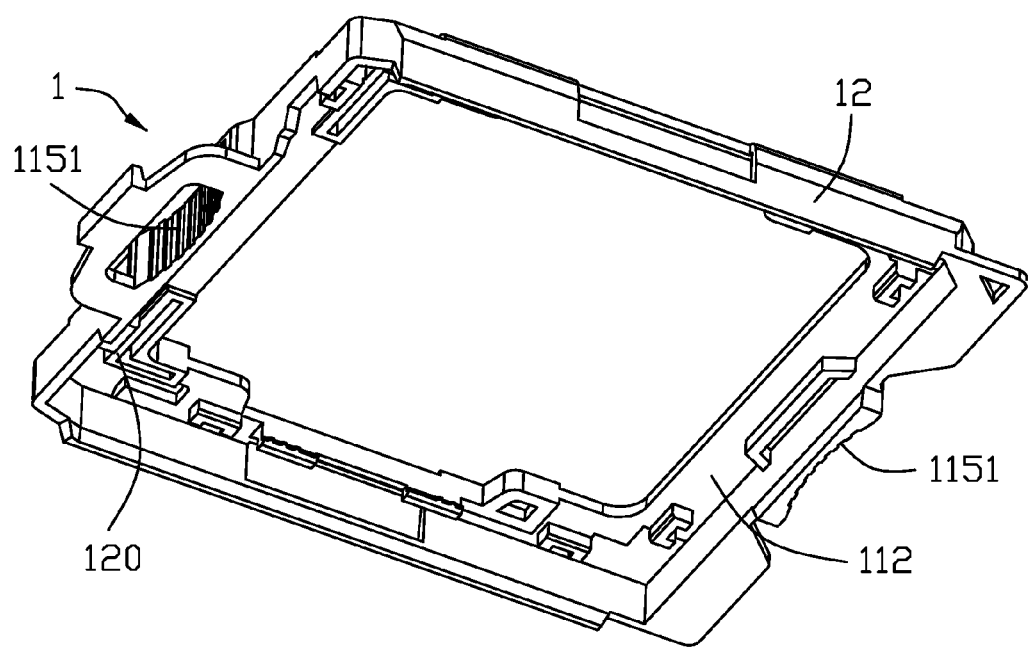
FIG. 2 is another perspective view of the pressing member shown in FIG. 1.

Reference will now be made in detail to the preferred embodiment of the present invention. Referring to FIG. 1 and FIG. 2, the present invention is provided with a pressing member 1. The pressing member 1 may carry a chip module 200. The pressing member 1 has a main body 11 retaining the chip module 200, a central opening 10 going through the main body 11 and provided for the chip module 200 going through and four side walls 12 extending downwardly from the main body 11.

The main body 11 is configured as a frame structure and has four corners 113. The main body 11 has an upper surface 111 and a lower surface 112 opposite to the upper surface 111. The main body 11 has a first side portion 114, a second side portion 115 opposite to the first side portion 114, a third side portion 116 and a fourth side portion 117 connecting the first side portion 114 and the second side portion 115. Upper surfaces of the first side portion 114, the second side portion 115, the third side portion 116 and the fourth side portion 117 are together to form the upper surface 111 of the pressing member 1. Lower surfaces 112 of the first side portion 114, the second side portion 115, the third side portion 116 and the fourth side portion 117 are together to form the lower surface 112 of the pressing member 1. The pressing member 1 defines two first pressing portions 118 respectively protruding upwardly from two ends of the first side portion 114 or from an end of the third side portion 116 adjacent to the first side portion 114 and an end of the fourth side portion 117 adjacent to the first side portion 114. The pressing member 1 has two second pressing portions 119 respectively protruding upwardly from a side of the third side portion 116 adjacent to the second side portion 115 and a side of the fourth side portion 117 adjacent to the second side portion 115. The first pressing portion 118 is higher than the second pressing portion 119. The pressing member 1 has four resisting portions 120 extending downwardly from four corners of the lower surface 112 of the main body 11 beyond the lower surface 112. The resisting portion 120 is used for pressing on the chip module 200. The first pressing portion 118 and the second pressing portion 119 may be formed by swelling the main body 11 upwardly or defining a block structure extending upwardly from the main body 11. The resisting portion 120 may be formed by swelling the main body 11 downwardly or defining a block structure extending downwardly from the main body 11. The swelling process forms a protruding portion and a recessing portion.

In the preferred embodiment, the first pressing portion 118, the second pressing portion 119 and the resisting portion 120 are all configured as L-shaped so as to make the pressing member 1 provide a pressing force evenly on the chip module 200. The first pressing portion 118 extends along the corresponding corner 113 of the main body 11.

Notably, the substance of the present invention is that the pressing member 1 has a pressing portion protruding upwardly from the upper surface 111 of the main body 11. The pressing portion is provided for an external device pressing downwardly on so as to make the main body 11 downwardly press on the chip module 200 to prevent the chip module 200 from warping. That is to say, the first pressing portion 118 and the second pressing portion 119 are together to function as the pressing portion. In other embodiments, the disposition of the position, the number, and the shape of the pressing portion and the resisting portion are depended on which electronic device the pressing member 1 is used in. For example, in some embodiments, the pressing member 1 may only have the pressing portion, but do not have the resisting portion 120; in some embodiments, the pressing member 1 may only have the first pressing portion 118, but do not have the second pressing portion 119.

Referring to FIG. 3 to FIG. 8, an electrical connector assembly 100 having the pressing member 1 will be described in detail herein the after. The electrical connector assembly 100 is used for connecting with a chip module 200. The chip module 200 has a base plate 201 and a protruding portion 202 protruding upwardly from a middle area of the base plate 201. The protruding portion 202 has a stepping portion 203 extending laterally. The stepping portion 203 has a stepping surface 2031 which is higher than an upper surface of the base plate 201 and lower than an upper surface of the protruding portion 202.

Figure 3:
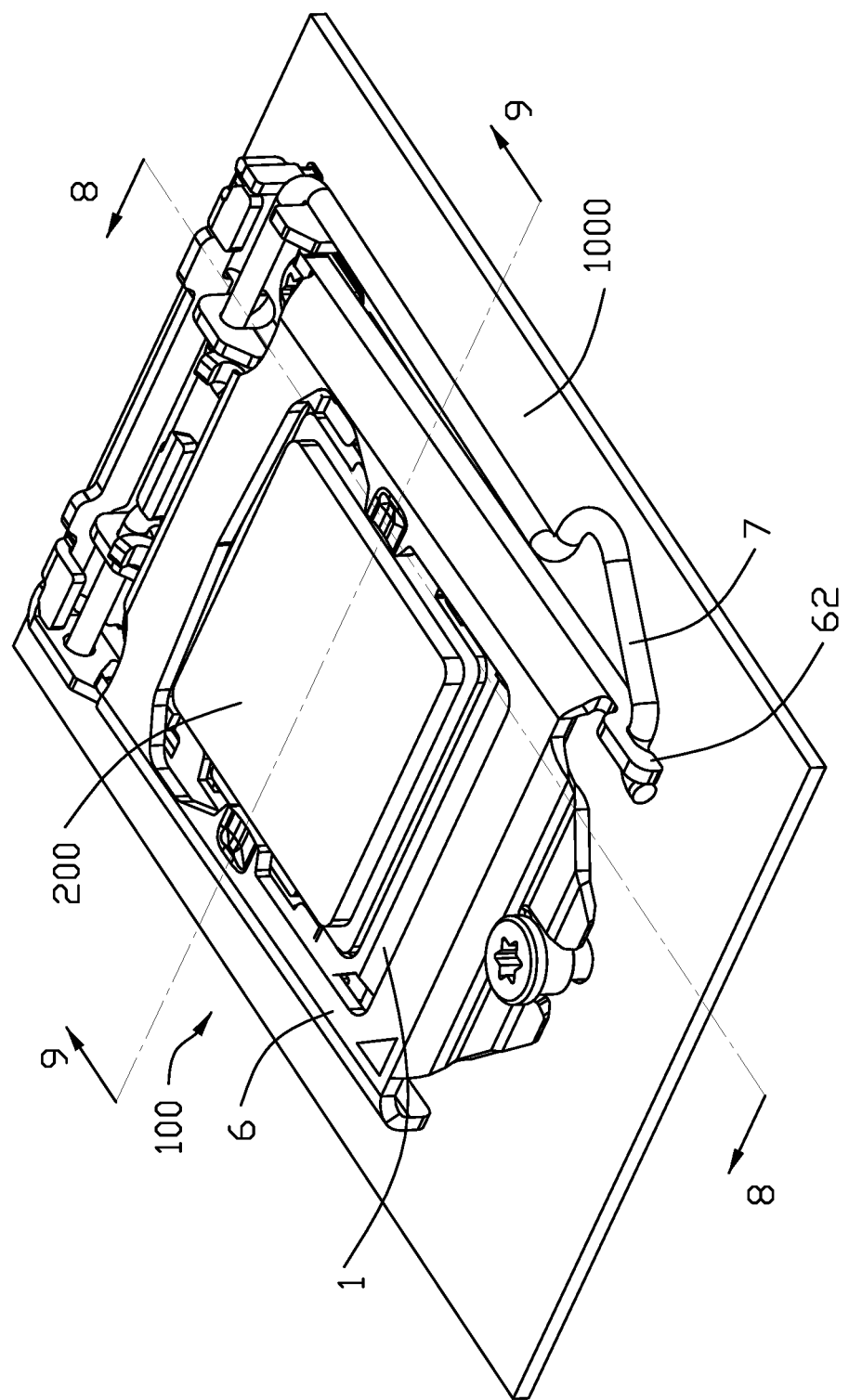
FIG. 3 is a perspective view of an electrical connector assembly having the pressing member shown in FIG. 1.
Figure 4:
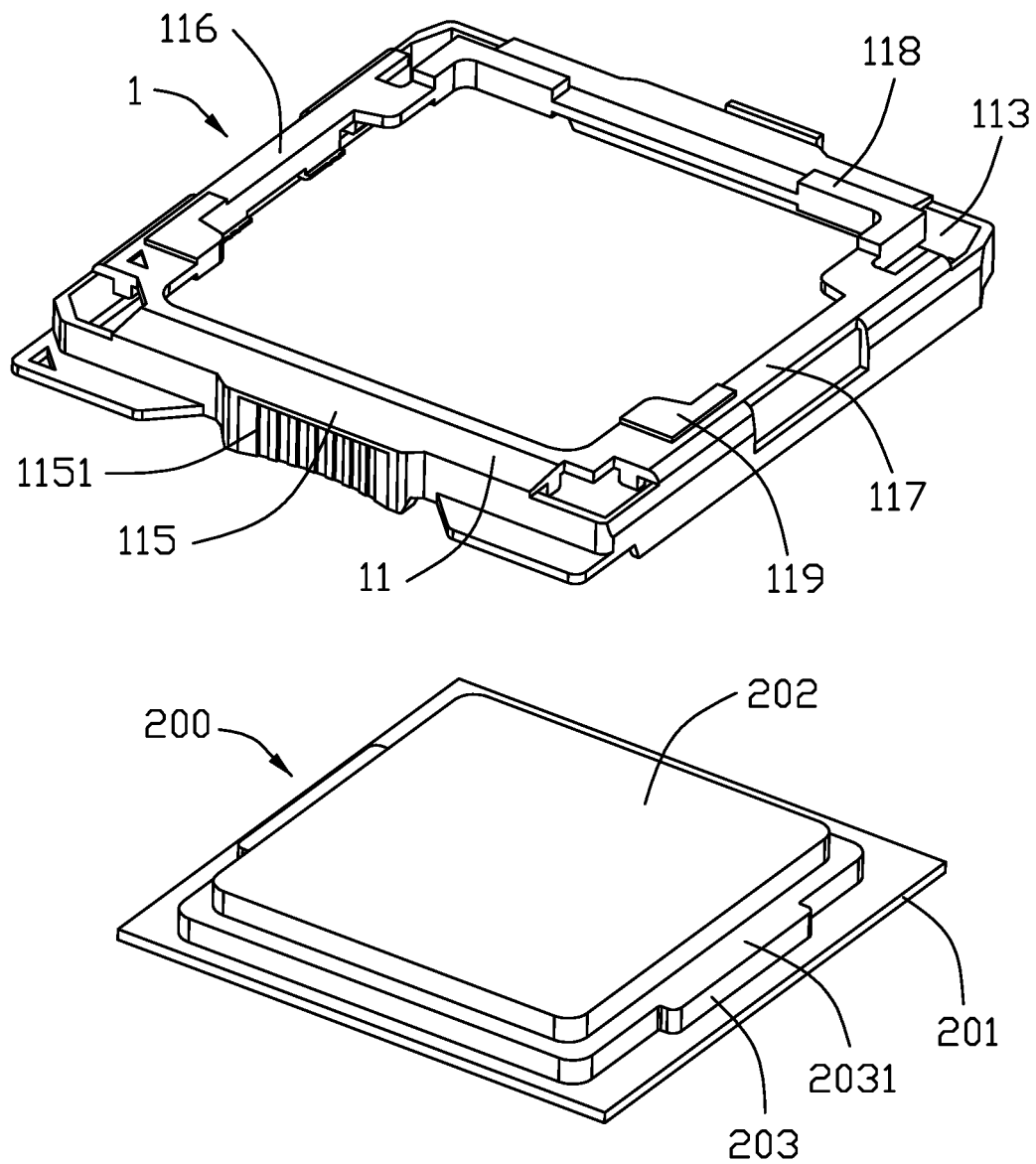
FIG. 4 is a perspective view of a pressing member and a chip module of the electrical connector assembly shown in FIG. 3, wherein the chip module is not assembled to the pressing member.
Figure 5:
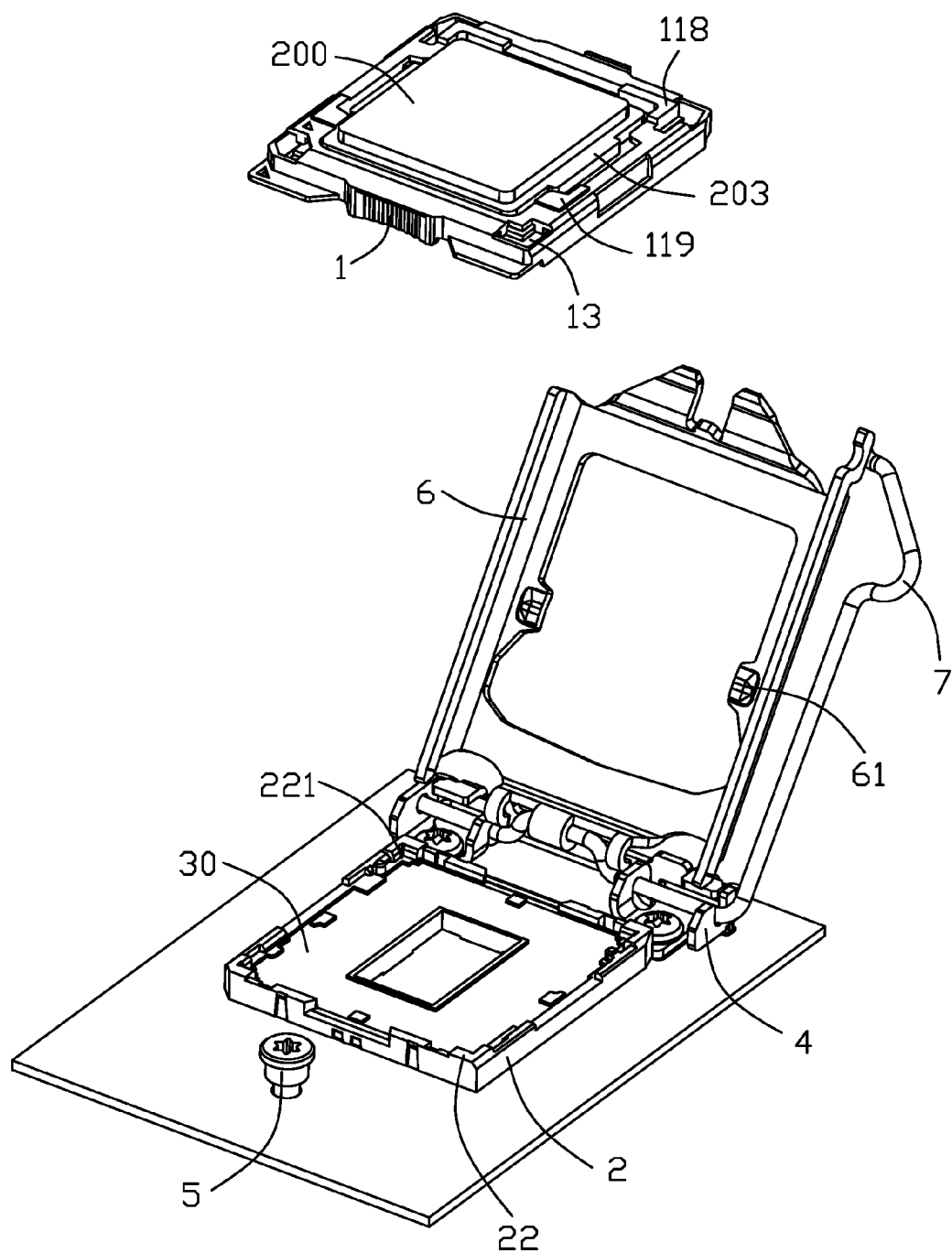
FIG. 5 is a part exploded perspective view of the electrical connector assembly shown in FIG. 3.
Figure 6:
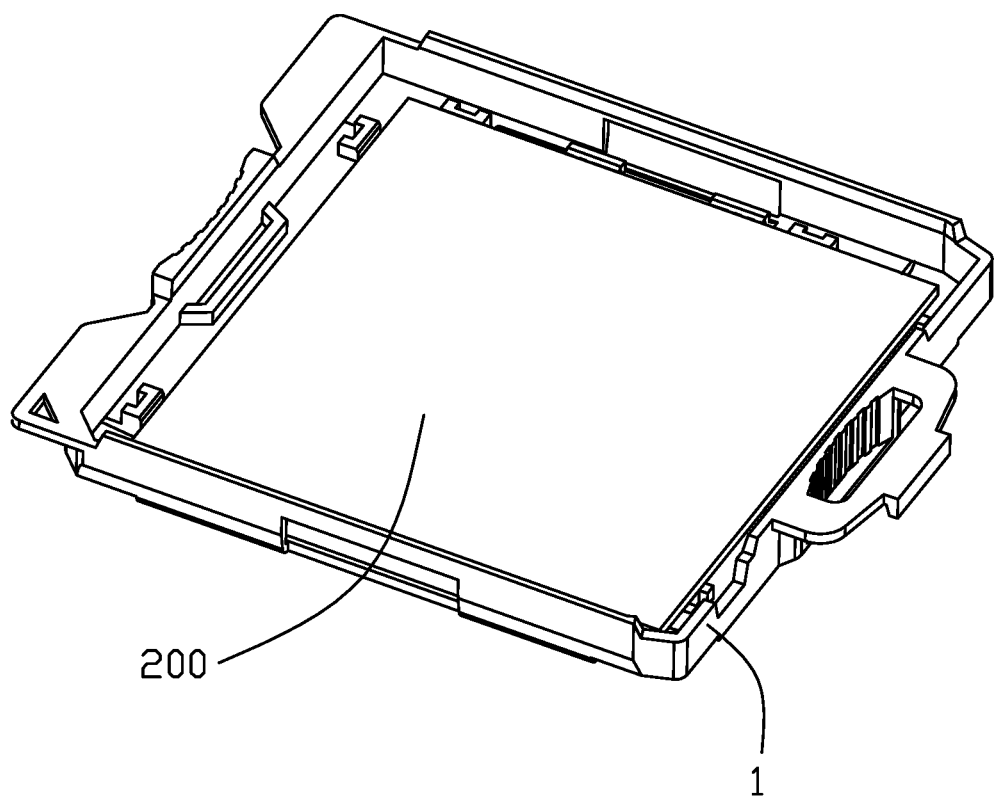
FIG. 6 is a perspective view of the chip module and the pressing member of the electrical connector assembly shown in FIG. 5, wherein the chip module is assembled within the pressing member.
Figure 7:
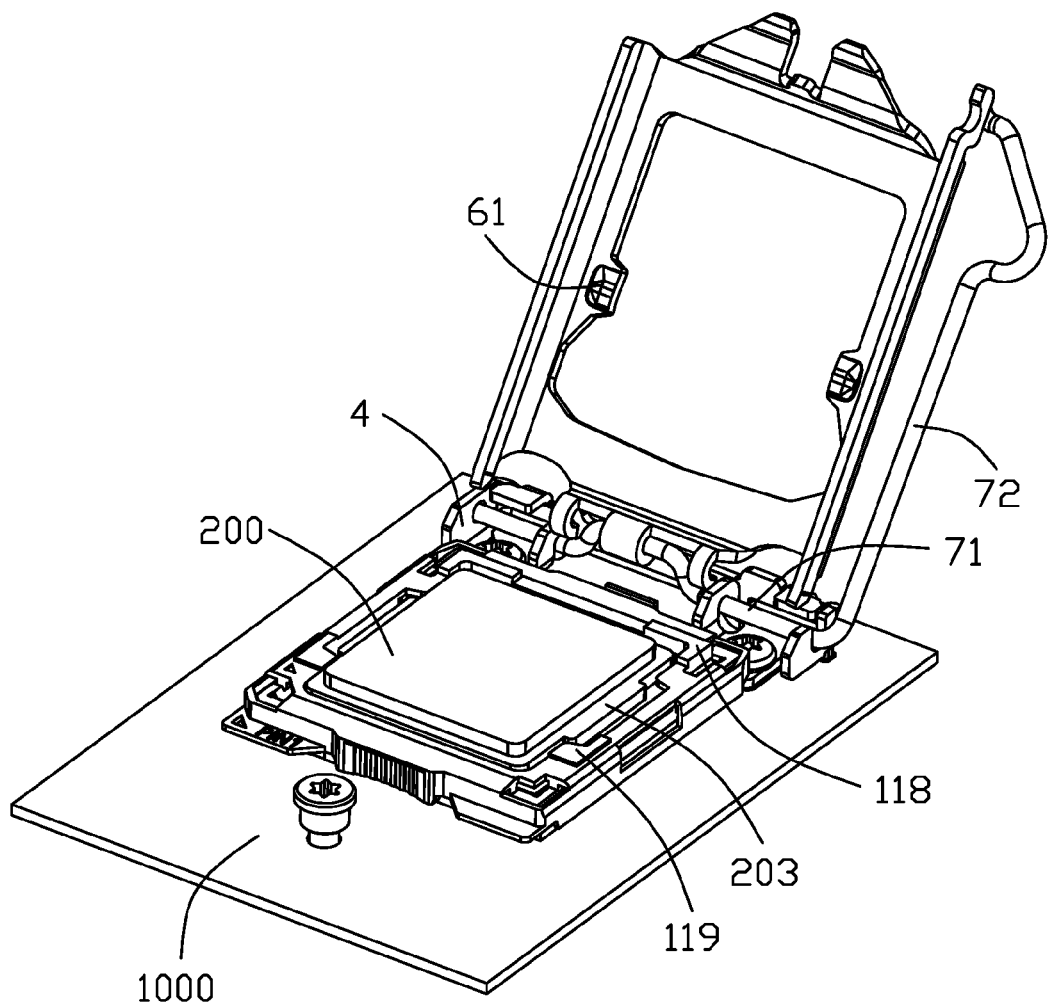
FIG. 7 is a perspective view of the electrical connector assembly shown in FIG. 5, wherein the pressing member and the chip module are received in an electrical connector shown in FIG. 5.

Referring to FIG. 3, FIG. 5 and FIG. 7, the electrical connector assembly 100 has a printed circuit board 1000, an electrical connector (not labeled) mounted onto the printed circuit board 1000 and the pressing member 1 mounted to the electrical connector. The electrical connector has an insulating housing 2, a plurality of conductive terminals (not shown) retained in the insulating housing 2, a connecting member 4 disposed at a side of the insulating housing 2, a retaining member 5 disposed at another side of the insulating housing 2 opposite to the connecting member 4 and a cover 6 pivoted to the connecting member 4. The cover 6 rotates to cover upon the insulating housing 2 and is retained by the retaining member 5.

Referring to FIG. 5 and FIG. 7, the insulating housing 2 is configured as rectangular shape and has a receiving cavity 30 opening upwardly. The conductive terminals (not shown) are exposed to the receiving cavity 30. The insulating housing 2 has at least a first guiding portion 22 at a corner thereof, and the main body 11 of the pressing member 1 has a second guiding portion 13 corresponding to the first guiding portion 22. The first guiding portion 22 and the second guiding portion 13 cooperate to guide the pressing member 1 to assemble to the insulating housing 2 along a top-to-bottom direction. In the present embodiment, the insulating housing 2 has four guiding posts protruding upwardly at four corners to function as the first guiding portions 22. The first guiding portions 22 are all disposed as L-shaped located at the four corners of the base plates 201 of the chip module 200, respectively. The first guiding portion 22 defines a guiding face 221 in an inner side thereof. The pressing member 1 has four guiding holes 13 at four corners to function as the second guiding portions 13 which are corresponding to the first guiding portions 22.

In this embodiment, the pressing member 1 functioning as a carrier has means, i.e., the barbed section (not labeled) in an interior edge thereof, for carrying the chip module 200 for downwardly loading the chip module 200 into the housing 2. When the pressing member 1 carries the chip module 200 to assemble to the insulating housing 2, the four corners of the base plate 201 move downwardly along the inclined guiding face 221, and the second guiding portion 13 is aligned to the first guiding portion 22 and moves downwardly. After finishing the assembly of the pressing member 1 and the chip module 200, the first guiding portion 22 is disposed within the second guiding portion 17. The first pressing portion 118 is located adjacent to the connecting member 4. The second pressing portion 119 is located far away from the connecting member 4. The first pressing portion 118 is higher than the stepping portion 203, and the stepping portion 203 is higher than the second pressing portion 119.

Figure 8:
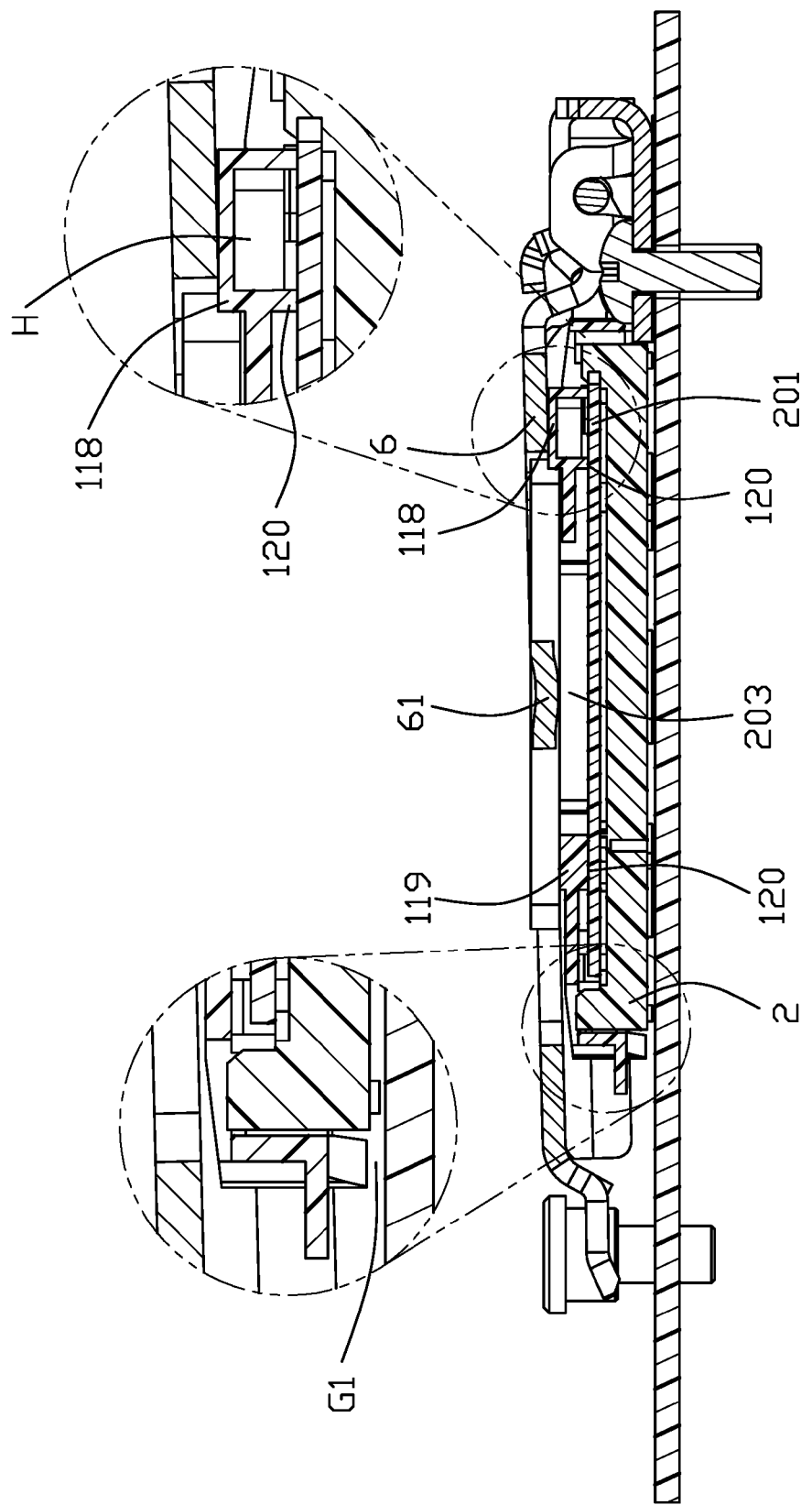
FIG. 8 is a sectional view of the electrical connector assembly along a line 8-8 shown in FIG. 3.
Figure 9:
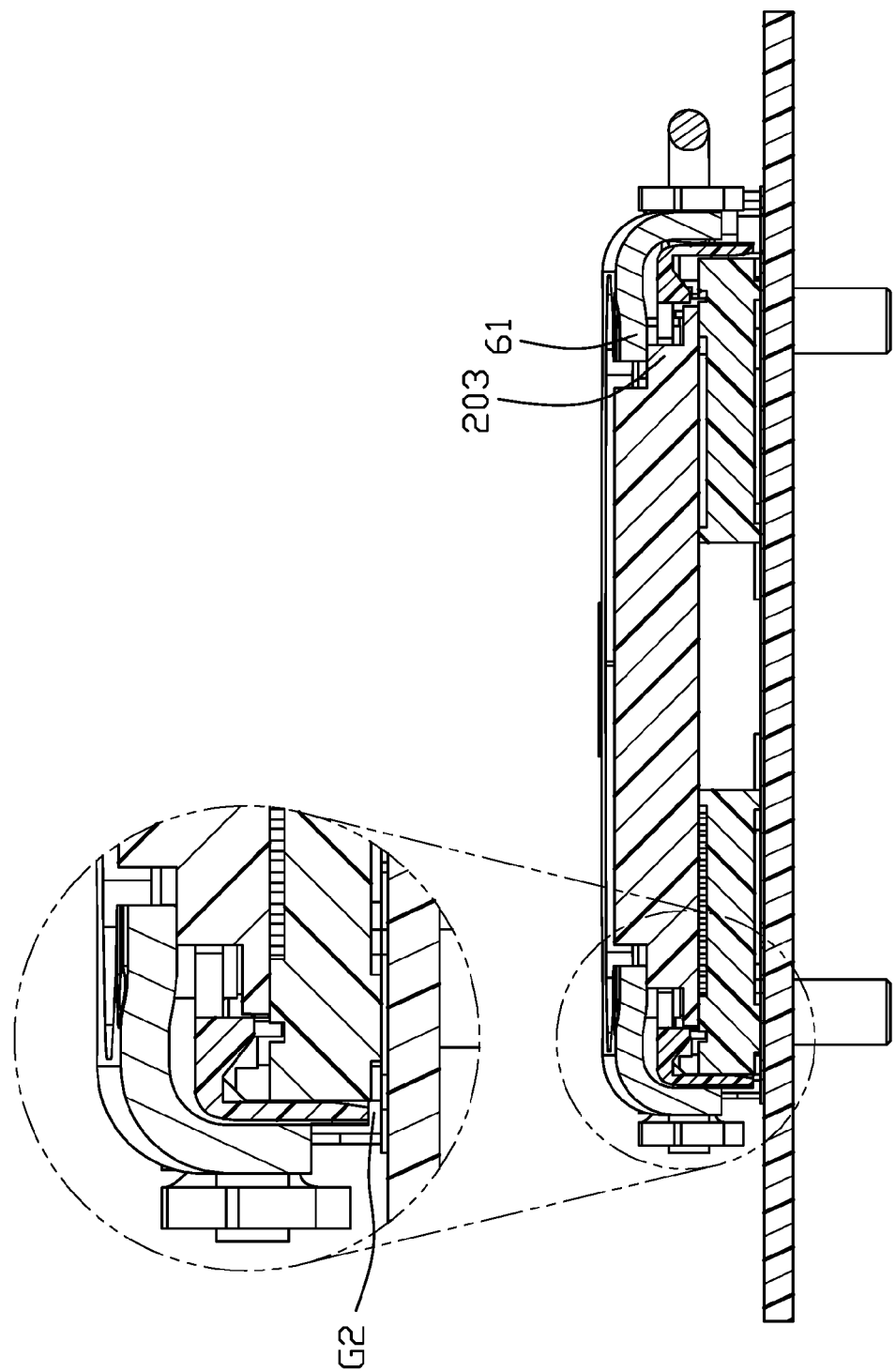
FIG. 9 is a sectional view of the electrical connector assembly along a line 9-9 shown in FIG. 3.

Referring to FIG. 3, FIGS. 8 and 9, the connecting member 4 has a rocking bar 7. The rocking bar 7 may rotate to retain the cover 6. The rocking bar 7 has a rotating portion 71 pivoted to a main portion (not labeled) of the connecting member 4 and an operating portion 72 perpendicular to the rotating portion 71. The cover 6 has a fixing portion 62 provided for fixing the operating portion 72. When the rocking bar 7 is rotated to be retained, the rotating portion 71 presses downwardly on an end of the cover 6, the retaining member 5 presses downwardly on another opposite end of the cover 6. The rocking bar 7 and the cover 6 are together work to make the cover 6 press downwardly on the chip module 200.

The cover 6 has two pressing plates 61 opposite to each other in the transverse direction to press downwardly on the corresponding stepping surfaces 2031. The cover 6 presses downwardly on the first pressing portion 118 to make the main body 11 press downwardly on the base plate 201 of the chip module 200 so as to prevent the base plate 201 from warping. In some embodiments, the pressing member 1 does not have the resisting portion 120, the lower surface 112 of the main body 11 directly presses downwardly on the base plate 201. In some embodiments, the pressing member 1 has the resisting portion 120 to press downwardly on the base plate 201, as a result, the pressing effect is better.

The pressing member 1 has a pressing portion 118, 119 protruding upwardly. An external device such as the cover 6 presses downwardly on the pressing portion to make the pressing member 1 presses downwardly on the chip module 200 so as to prevent the chip module 200 from warping effectively.

In some other embodiments, the structure of the pressing member 1 will stay unchanged, the cover 6 may define a protruding portion protrudes downwardly to presses downwardly on the pressing member 1 to make the pressing member 1 press downwardly on the chip module 200. In some other embodiments, the pressing member 1 may be directly assembled to the electrical connector as a whole. In some other embodiments, the cover 6 may be directly put upon the pressing member 1 other than by the rotating way. In brief, the features of the invention may include provision of downward forces upon four corners of the base plate 201 of the chip module 200 via the pressing member 1 wherein either the pressing member forms the corresponding upward protruding pressing portions 118 to contact the cover 6 or the cover 6 forms the corresponding downward protruding pressing portions (not shown) to downwardly press the pressing member 1. Also, because the base plate 201 is relatively flexible compared with the thickened protruding portion 202 and the step portion 203, in this embodiment the pressing portion 118 associated with the corresponding resisting portion 120 is essentially hollow with a cavity H therein so as not to be relatively rigid during operation for not harming the corners of the base plate improperly but in a buffered manner. Notably, such hollowed structure may facilitate the molding process of the pressing member 1 also. In addition, in this embodiment, because the pressing member 1 endures pressure from the cover 6, the bottom edge of the pressing member 1 is intentionally spaced from the printed circuit board 1000 with in the vertical direction the gap G1 (FIG. 8) along the side extending in the transverse direction and with the gap G2 (FIG. 9) along the side extending the front-to-back direction for not being improperly compressed by the cover 6 to be jeopardized. Another feature of the invention is to provide an enlarged rugged grasping area 1151 on each side of the pressing member 1 extending in the transverse direction so as to easily and stably load the chip module 200 via the associated pressing member 1, which functions as a carrier, into the housing 2.

It is to be understood, however, that even though numerous characteristics and advantages of the present invention have been set forth in the foregoing description, together with details of the structure and function of the invention, the disclosure is illustrated only, and changes may be made in detail, especially in matters of shape, size, and arrangement of parts within the principles of the invention to the full extent indicated by the broad general meaning of the terms in which the appended claims are expressed.

We claim:

1. A pressing member used for downwardly pressing on a chip module, comprising:
    a main body to carry a base plate of the chip module and having an upper surface and a lower surface opposite to the upper surface; and
    a central opening going through the main body and provided for a protruding part portion of the chip module going through;
    wherein the pressing member has a set of pressing portions protruding upwardly from the upper surface and is provided for an external device pressing downwardly on to make the main body press downwardly on the base plate of the chip module so as to prevent the chip module from warping;
    wherein the pressing portions includes a pair of higher first pressing portions locating at a rear side of the upper surface and a pair of lower second pressing portions locating at a front side of the upper surface; wherein the main body is configured as a frame structure and has four corners, and four through holes passing through the four corners of the main body, the first pressing portions locate near to both two respective rear corners of the central opening and two respective rear through holes of the main body; the second pressing portions locate at side edges of the central opening, and keep away from both two respective front corners of the central opening and two respective front through holes of the main body; wherein the first pressing portions extend into the respective rear through holes of the main body, and the second pressing portions extend into the central opening.

2. The pressing member as claimed in claim 1, wherein each of the first pressing portions is present as an L-shape and integrally connect two adjacent side portions of the main body.

3. The pressing member as claimed in claim 1, wherein each of the second pressing portions is present as an L-shape but integrally connect only one side portion of the main body.

4. The pressing member as claimed in claim 1, wherein the pressing member has four resisting portions extending downwardly from the lower surface of the main body and corresponding to the respective first and second pressing portions for pressing on the chip module.

5. The pressing member as claimed in claim 4, wherein each of the corresponding resisting portion is essentially hollow with a cavity recessed upwardly from a lower surface thereof.

6. An electrical connector assembly used for connecting with a chip module, the chip module having a base plate and a protruding portion protruding upwardly from the base plate, the electrical connector assembly comprising:
    an electrical connector having an insulating housing, a plurality of conductive terminals retained in the insulating housing and a cover having a first pressing portion directly pressing downwardly on the protruding portion; and
    a pressing member mounted to the electrical connector, the pressing member having a main body including an upper surface, a lower surface opposite to the upper surface and a central opening going through the main body and provided for the protruding portion going through;
    wherein the pressing member has a pressing portion located at the upper surface, the cover has another pressing portion provided for pressing downwardly on the pressing portion to make the main body press downwardly on the base plate of the chip module so as to prevent the base plate from warping.

7. An electrical connector assembly as claimed in claim 6, wherein the pressing member has means for carrying the chip module to assemble to the insulating housing.

8. The electrical connector assembly as claimed in claim 6, wherein the pressing portion of the pressing member protrudes upwardly from the upper surface.

9. The electrical connector assembly as claimed in claim 6, wherein said another pressing portion protrudes downwardly from the cover.

10. The electrical connector assembly as claimed in claim 6, wherein the electrical connector has a connecting member disposed at a side of the insulating housing, the cover is pivoted to the connecting member, the main body has a corner at a side adjacent to the connecting member, the corner of the main body is corresponding to a corner of the base plate, and the third pressing portion has an inner pressing portion located at the corner.

11. The electrical connector assembly as claimed in claim 10, wherein the protruding portion of the chip module has a stepping portion extending laterally, when the chip module is assembled within the pressing member, the pressing portion is higher than the stepping portion.

12. An electrical connector assembly comprising:
    a printed circuit board;
    an insulative housing mounted upon the printed circuit board in a vertical direction and equipped with terminals therein;
    a chip module disposed in the housing to be mechanically and electrically connected to the terminals, said chip module including a base plate and a step portion upwardly extending from the base plate;
    a pressing member located upon the chip module; and
    a metallic cover movable relative to the housing and indirectly pressing downwardly the base plate via said pressing member around four corners of said base plate; wherein
    bottom edges of at least four corners of said pressing member are spaced from the printed circuit board with respective gaps in said vertical direction for preventing excessive compression forces upon the pressing member.

13. The electrical connector assembly as claimed in claim 12, wherein the pressing member includes upward protruding pressing portions and downward extending resisting portions around said four corners thereof for transferring forces from the cover toward the four corners of the base plate so as to assure proper connection between the chip module and the terminals around four corners of the base plate.

14. The electrical connector assembly as claimed in claim 13, wherein at each of said four corners of the pressing member, at least one of the corresponding pressing portion and the resisting portion is hollow.

15. The electrical connector assembly as claimed in claim 12, wherein the cover includes a pair of opposite pressing plates in a transverse direction perpendicular to said vertical direction to downwardly press the step portion of the chip module.

16. The electrical connector assembly as claimed in claim 15, wherein said pressing member includes a pair of opposite enlarged grasping sections on a pair of opposite sides opposite to each other in the front-to-back direction perpendicular to both said vertical direction and said transverse direction.

17. The electrical connector assembly as claimed in claim 15, wherein said pressing member forms a cavity to carry the chip module therein associatively, and bottom edges of peripheries of the whole pressing member surrounding the chip module, are spaced from the printed circuit board in the vertical direction.

* * * * *